(12) United States Patent
Ming et al.

(10) Patent No.: US 12,211,713 B2
(45) Date of Patent: *Jan. 28, 2025

(54) APPARATUS, SYSTEM, AND METHOD OF PROVIDING A RAMPED INTERCONNECT FOR SEMICONDUCTOR FABRICATION

(71) Applicant: JABIL INC., St. Petersburg, FL (US)

(72) Inventors: Lim Lai Ming, St. Petersburg, FL (US); Zambri Bin Samsudin, St. Petersburg, FL (US)

(73) Assignee: JABIL INC.

( * ) Notice: Subject to any disclaimer, the term of this patent is extended or adjusted under 35 U.S.C. 154(b) by 0 days.

This patent is subject to a terminal disclaimer.

(21) Appl. No.: 18/529,193

(22) Filed: Dec. 5, 2023

(65) Prior Publication Data
US 2024/0178016 A1 May 30, 2024

Related U.S. Application Data

(63) Continuation of application No. 17/391,120, filed on Aug. 2, 2021, now Pat. No. 11,862,492, which is a
(Continued)

(51) Int. Cl.
| H01L 21/67 | (2006.01) |
| C23C 18/08 | (2006.01) |
| H01L 21/48 | (2006.01) |

(52) U.S. Cl.
CPC ........ H01L 21/67138 (2013.01); C23C 18/08 (2013.01); H01L 21/485 (2013.01)

(58) Field of Classification Search
CPC ....... H01L 2924/00; H01L 2924/00014; H01L 2224/45147; H01L 2224/45139; H01L 2924/01047
See application file for complete search history.

(56) References Cited

U.S. PATENT DOCUMENTS

| 2006/0131233 A1 | 6/2006 | Gigas |
| 2006/0131283 A1 | 6/2006 | Hall |
| (Continued) | | |

FOREIGN PATENT DOCUMENTS

| KR | 20100004067 | 1/2010 |
| WO | 0060662 | 10/2000 |

OTHER PUBLICATIONS

International Preliminary Report on Patentability for PCT/2019/047084, dated Dec. 5, 2019.
(Continued)

*Primary Examiner* — Jaehwan Oh
(74) *Attorney, Agent, or Firm* — Riverside Law LLP

(57) ABSTRACT

The disclosure is and includes at least an apparatus, system and method for a ramped electrical interconnection for use in semiconductor fabrications. The apparatus, system and method includes at least a first semiconductor substrate having thereon a first electrical circuit comprising first electrical components; a second semiconductor substrate at least partially covering the first electrical circuit, and having thereon a second electrical circuit comprising second electrical components; a ramp formed through the second semiconductor substrate between at least one of the first electrical components and at least one of the second electrical components; and an additively manufactured conductive trace formed on the ramp to electrically connect the at least one first electrical component and the at least one second electrical component.

16 Claims, 5 Drawing Sheets

Related U.S. Application Data continuation of application No. 17/003,595, filed on Aug. 26, 2020, now Pat. No. 11,081,375, which is a continuation of application No. 16/104,716, filed on Aug. 17, 2018, now Pat. No. 10,790,172.

(56) References Cited

U.S. PATENT DOCUMENTS

| | | | |
|---|---|---|---|
| 2007/0286946 A1 | 12/2007 | Yamaguchi | |
| 2010/0140811 A1* | 6/2010 | Leal | H01L 24/76 257/E23.141 |
| 2011/0254171 A1* | 10/2011 | Guo | H01L 23/5387 257/774 |
| 2011/0266684 A1* | 11/2011 | Leal | H01L 21/76828 257/E21.24 |
| 2011/0272825 A1* | 11/2011 | McGrath | H01L 25/0657 257/E21.503 |
| 2016/0198576 A1* | 7/2016 | Lewis | B29C 64/106 361/761 |
| 2017/0015066 A1* | 1/2017 | Herrmann | B29C 70/68 |
| 2017/0263536 A1 | 9/2017 | Lin | |
| 2017/0359896 A1* | 12/2017 | Kim | H05K 3/4015 |
| 2018/0005993 A1 | 1/2018 | Chen | |
| 2018/0130735 A1 | 5/2018 | Buvid | |
| 2020/0058527 A1* | 2/2020 | Ming | H05K 3/4069 |

OTHER PUBLICATIONS

International Search Report for PCT/US2019/047084, dated Aug. 17, 2018.
Written Opinion of the International Searching Authority for PCT/US2019/047084, dated Dec. 5, 2019.

* cited by examiner

APPARATUS, SYSTEM, AND METHOD OF PROVIDING A RAMPED INTERCONNECT FOR SEMICONDUCTOR FABRICATION

CROSS-REFERENCE TO RELATED APPLICATIONS

The present application is a Continuation Application of U.S. application Ser. No. 17/391,120, filed Aug. 2, 2021, entitled: "Apparatus, System, and Method of Providing a Ramped Interconnect for Semiconductor Fabrication", which is a Continuation Application of U.S. application Ser. No. 17/003,595, filed Aug. 26, 2020, and which issued on Aug. 3, 2021, as U.S. Pat. No. 11,081,375, entitled: "Apparatus, System, and Method of Providing a Ramped Interconnect for Semiconductor Fabrication", which is a Continuation Application of U.S. application Ser. No. 16/104,716, filed Aug. 17, 2018, and which issued on Sep. 29, 2020, as U.S. Pat. No. 10,790,172, entitled: "Apparatus, System, and Method of Providing a Ramped Interconnect for Semiconductor Fabrication", each of which are herein incorporated by reference in their entirety.

BACKGROUND

Field of the Disclosure

The disclosure relates generally to semiconductor fabrication, and, more particularly, to an apparatus, system, and method of providing a ramped interconnect.

Background of the Disclosure

In known semiconductor fabrication techniques, a vertical interconnect access, or VIA, is a conductive pathway used to provide electrical contact between multiple layers of a multi-layer semiconductor device. The VIA comprises a hole that passes vertical from one layer perpendicularly down to the next layer. The hole is then filled, or the side walls thereof coated, with a conductive material, such as copper, to provide the aforementioned conductive path between circuit layers.

However, known VIAs suffer from several significant drawbacks. For example, as the vertical hole of the VIA must be filled with conductive material, or at least the sidewalls thereof completely coated, from the first circuit layer all the way up to and including the plane provided by the second circuit layer in order to provide the requisite electrical connection between circuit layers, difficulties may arise in the process or laying the conductive material that creates and fills the VIA. For example, such difficulties may include curing of the conductive material in the hole prior to the conductive material reaching all the way down to the first circuit layer, such that a non-conductive gap occurs at the lower portion of the VIA; the VIA walls being overly rough, such that the conductive material gets "caught" along the VIA side walls, which impedes or negates conductivity; roughing of the conductive material as it is inserted, such that open holes are created in the VIA that adversely affect conductivity; and mechanical instability of the conductive material in the hole such that VIA conductivity is adversely affected, such as because of a lack of mechanical support necessary to support the vertical rise of the VIA, by way of non-limiting example.

SUMMARY OF THE DISCLOSURE

The disclosure is and includes at least an apparatus, system and method for a ramped electrical interconnection for use in semiconductor fabrications. The apparatus, system and method includes at least a first semiconductor substrate having thereon a first electrical circuit comprising first electrical components; a second semiconductor substrate at least partially covering the first electrical circuit, and having thereon a second electrical circuit comprising second electrical components; a ramp formed through the second semiconductor substrate between at least one of the first electrical components and at least one of the second electrical components; and an additively manufactured conductive trace formed on the ramp to electrically connect the at least one first electrical component and the at least one second electrical component.

BRIEF DESCRIPTION OF THE DRAWINGS

The disclosure is illustrated by way of example and not limitation in the accompanying drawings, in which like references may indicate similar elements, and in which.

DETAILED DESCRIPTION

Figure 1:
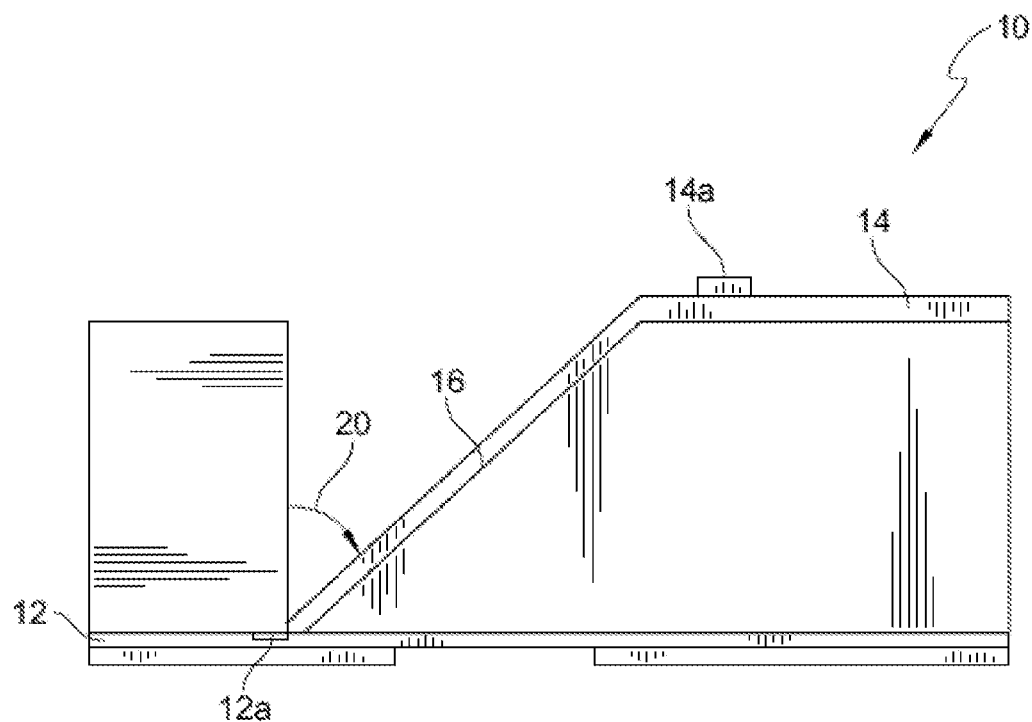
FIG. 1 illustrates a cross-sectional view of an exemplary RIA system.

The figures and descriptions provided herein may have been simplified to illustrate aspects that are relevant for a clear understanding of the herein described devices, systems, and methods, while eliminating, for the purpose of clarity, other aspects that may be found in typical similar devices, systems, and methods. Those of ordinary skill may recognize that other elements and/or operations may be desirable and/or necessary to implement the devices, systems, and methods described herein. But because such elements and operations are well known in the art, and because they do not facilitate a better understanding of the present disclosure, a discussion of such elements and operations may not be provided herein. However, the present disclosure is deemed to inherently include all such elements, variations, and modifications to the described aspects that would be known to those of ordinary skill in the art.

The terminology used herein is for the purpose of describing particular example embodiments only and is not intended to be limiting. For example, as used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc., may be used herein to describe various elements, components, regions, layers and/or sections, these elements, components, regions, layers and/or sections should not be limited by these terms. These terms may be only used to distinguish one element, component, region, layer or section from another element, component, region, layer or section. That is, terms such as "first," "second," and other numerical terms, when used herein, do not imply a sequence or order unless clearly indicated by the context. Thus, a first element, component, region, layer or section discussed below could be termed a second element, component, region, layer or section without departing from the teachings of the exemplary embodiments.

To the extent processor-implemented modules, systems and methods of design and control use are disclosed herein, they may provide access to and transformation of a plurality of types of digital content, including but not limited to video, image, text, audio, metadata, algorithms, interactive and document content, and may track, deliver, manipulate, transform and report the accessed content. Described embodiments of these modules, systems and methods are intended to be exemplary and not limiting. As such, it is contemplated that the herein described systems and methods may be adapted and may be extended to provide enhancements and/or additions to the exemplary modules, systems and methods described. The disclosure is thus intended to include all such extensions.

Embodiments include the generation of ramped electrical interconnections using additive manufacturing techniques, i.e., 3D printing, and conductive inks, such as nanoparticle conductive inks, in multilayer, such as two layers, circuits. By way of example, embodiments may allow for integration and interconnection of molded top and bottom circuits, and may additionally include capabilities to place surface mount components within end-mold electronics.

More particularly, a multilayer, such as a two layer, circuit may have a ramped version of a "VIA" (vertical interconnect access), also referred to herein as a ramp interconnect access (RIA), which provides a connection non-vertical VIA between two layers of the multilayer circuit. The RIA ramp may be created by any known methodology, such as by molding, machining, cutting, or the like. For example, laser drilling, laser micro machining, C&C machining, shape molding, and the like may be methodologies employed in the embodiments to create the ramp without departing from the disclosure. By way of particular non-limiting example, a C&C machine may be used to remove a ramp-shaped slice from a second circuit layer substrate, whereby a ramp is created having a high point starting at the plane of the second layer circuit, and having a low point ending slightly below, at, or slightly above a plane provided for the first circuit level. Conductive material may then be added to the ramp to provide a RIA interconnecting the first and second layer circuits.

Thereby, the embodiments may remedy drawbacks of a typical VIA's vertical holes, which are generally used to electrically connect layers of a multilayer circuit in the prior art. In a known VIA context, the vertical hole must be filled with conductive material from the first circuit layer all the way up to and including the plane provided by the second circuit layer in order to provide the electrical connection. However, in typical prior art embodiments, difficulties may arise in the process that creates and fills the VIA. For example, such difficulties may include curing of the conductive material in the hole prior to the conductive material reaching all the way down to the first circuit layer, such that a non-conductive gap occurs at the lower portion of the VIA; the VIA walls being overly rough, such that the conductive material gets "caught" along the VIA side walls, which impedes or negates conductivity; roughing of the conductive material as it is inserted, such that open holes are created in the VIA that adversely affect conductivity; and mechanical instability of the conductive material in the hole such that VIA conductivity is adversely affected, such as because of a lack of mechanical support necessary to support the vertical rise of the VIA, by way of non-limiting example.

In the embodiments, additive manufacturing methodologies may be used, once the ramp is created, to additively provide the conductive material that provides the conductive path from the first circuit layer to the second, or subsequent, circuit layer. Such conductive material may be provided, by way of non-limiting example, by piezo-jet printing, inkjet printing, by screen printing, or by any similar known methodology suitable to provide the characteristics discussed herein. By way of non-limiting example, a piezo-jet printing head, provided by Neotech AMT GmbH, may be used to inject ink through a piezo-actuator based on applying force to the ink to thus provide a drop-on-demand nozzle that allows for the regulation of each ink drop printed. The ability to regulate ink drops upon ejection from a print head may allow for refined control of the ink thus printed, which, as will be understood to the skilled artisan, improves the conductivity and stability provided by the RIA created in the embodiments. For example, regulated ink ejection may allow for ink drops of a preselected size to be dropped on demand from a range of 5 to 30 mm of distance above the print surface, and may allow for the printing of the RIAs disclosed herein in three dimensions, such as dependent on ink type and other processing factors discussed throughout.

Of course, typical additive manufacturing process parameters may be considered in the embodiments, and varied in accordance with the creation of particular types of RIA, as will be appreciated by the skilled artisan in light of the discussion herein. For example, a piezo-jet printer head with a 50 micrometer/03 nozzle type may be employed, such as with a print frequency of 250 Hz.

FIG. 1 illustrates a cross-sectional view of an exemplary RIA system 10 according to the embodiments. In the illustration, a first layer circuit 12 and a second layer circuit 14 may be provided in a first plane and a second plane, respectively. By way of example, the first layer circuit 12 may be built upon any suitably receptive surface, such as a polycarbonate film, and/or may comprise one or more traces, plates, or plated traces, such as a Cu plated trace. The second layer circuit 14 may be provided upon a surface provided physically upon the first layer circuit 12 that does not interfere with operation of the first layer circuit 12, such as any production plastic material, such as a molded Acrylonitrile Butadiene Styrene (ABS).

As illustrated, a ramped area 16 may be provided from the second layer circuit 14 "downward" at a given angle 20 to the first layer circuit 12. Upon the ramp 16 thus provided may be additively manufactured a conductive RIA 22 that interconnects conductive components 12a, 14a of the second layer circuit 14 and the first layer circuit 12. As illustrated in the example of FIG. 1, the ramp angle 20 may vary, by way of non-limiting example, between about 45° and 70°. Moreover, the ramp size may be approximately 500 to 1500 microns, or, more particularly, 800 to 1000 microns, by way of non-limiting example.

Figure 2:
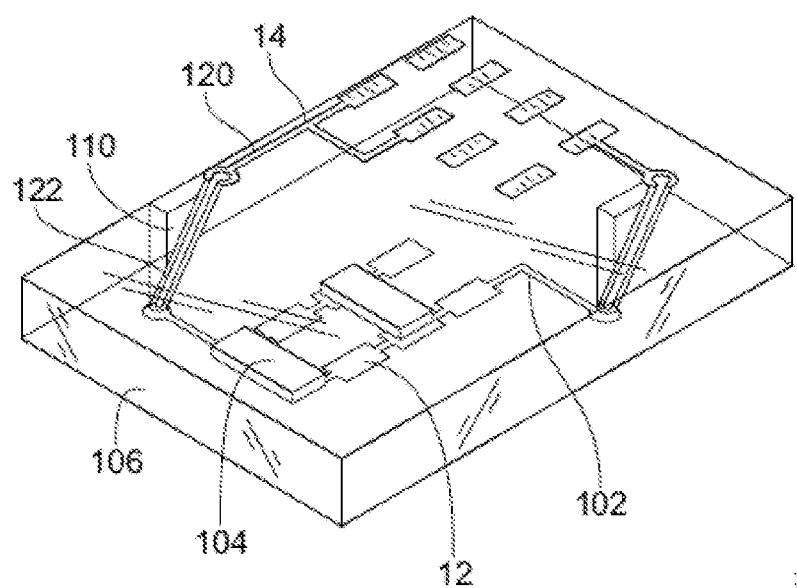
FIG. 2 shows an isometric view of a first and a second layer circuit according to the embodiments.

FIG. 2 shows an isometric view of a first 12 and second layer 14 circuit according to the embodiments. In the illustration, the first layer circuit 12 includes conductive traces 102 and surface mount technology (SMT) components 104 embedded within the molded substrate 106 upon which the second layer circuit 14 is provided. In the illustration, a ramped area 110 may be provided, such as by "drilling", machining, or otherwise removing or creating of a triangular area to provide an angled ramp 110 from a conductive trace on the second layer circuit 120 to the conductive trace 102 on the first layer circuit 12, as shown. Also illustrated is a conductive material 122, such as a conductive printed ink, additively placed along the full linear distance of the ramp to thereby conductively connect the second layer trace 120 to the first layer trace 102. By way of non-limiting example, the ink used may be a silver conductive ink and may be printed by a piezo-jet print head, such as is discussed throughout. Additionally, a "target", such as a target conductive disc or the like, may be provided in electrical connection to the first trace 102 at the base of the ramp, i.e., at ramp point 3 as discussed herein. This target may provide enhanced connectivity of the conductive material 122 along the ramp to the first layer trace 102. Of note, connective point 12a of FIG. 1 may be, for example, such a target.

Figure 3:
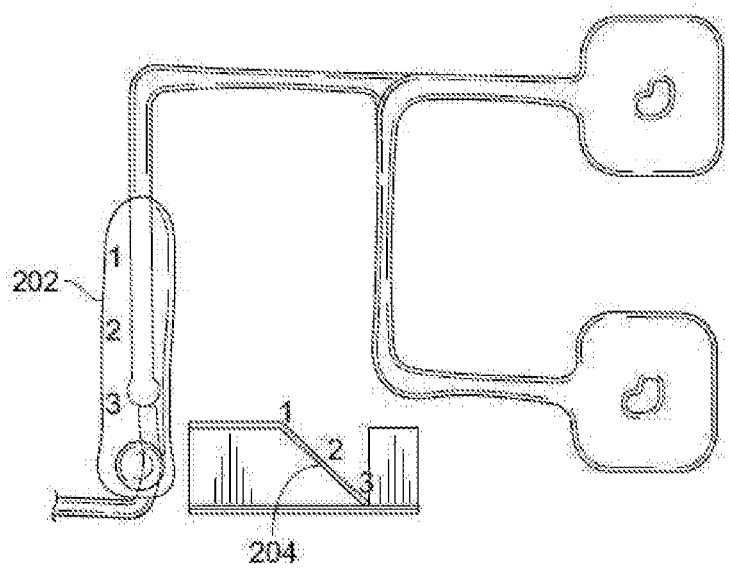
FIG. 3 illustrates a circuit level view of a RIA in accordance with some embodiments.

FIG. 3 illustrates a circuit level view of a RIA 202 in accordance with some embodiments. Further, FIG. 3 includes an inset akin to the illustration of FIG. 1, wherein points 1, 2 and 3 along the ramp 204 may be compared to the actual points 1, 2 and 3 in the actual circuit 202 of FIG. 3. The printed material 122 printed "down" the ramp of the RIA 202 may be further viewed in an actual circuit with respect to FIG. 4, which again includes the inset illustration akin to that of FIG. 1 that compares points 1, 2 and 3 along the ramp in actuality, and in a schematic cross-sectional view.

Figure 4:
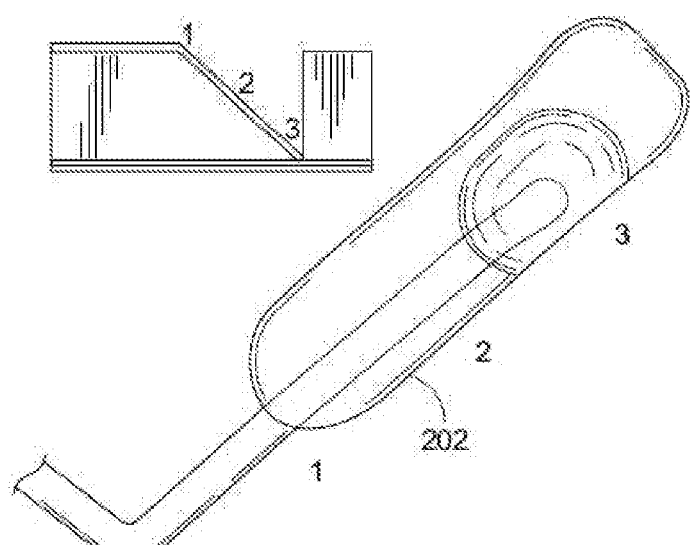
FIG. 4 illustrates an exemplary RIA.

Of note, particularly with respect to the exemplary illustration of FIG. 4, a sharp edge at ramp point 1, or a surface having extraordinary roughness proximate to point 2 and along the slope of the ramp, may adversely affect conductivity of the RIA 202. As such, the ramp along its slope and/or at points proximate to point 2 may have a suitable roughness matched to the printed ink used to provide the RIA, such that conductivity is maintained; and the topmost area of the RIA, i.e., the ramp at point 1, may be rounded or otherwise smoothed to eliminate sharp edges, and thus prevent cracks, voids, or thin spots for the printed ink as it initially descends the RIA from the first level circuit to the second level circuit.

Figure 5:
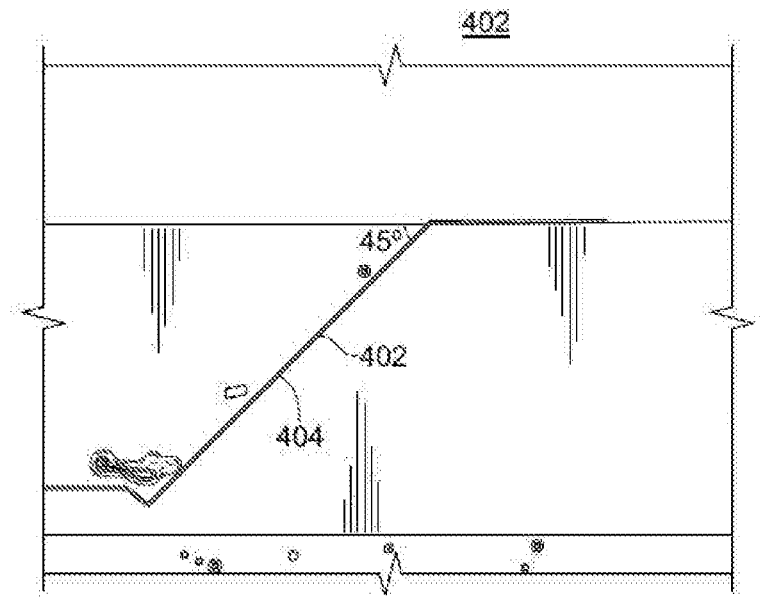
FIG. 5 illustrates an exemplary RIA.

FIG. 5 illustrates an exemplary RIA 402 having a ramp 404 at an angle of approximately 46°. As illustrated, the ink thickness of the RIA 402 may vary at points along the ramp, such that conductivity is maintained. By way of non-limiting example, the ink thickness in microns at point 1 of the RIA 402 may be, by way of non-limiting example, between 25 and 75 microns, or more particularly between 30 and 45 microns, such that the concerns referenced above with regard to the sharper edge at the inception of the RIA at point 1 are addressed so that conductivity is maintained as the RIA ramps downward. However, at point 2 of the RIA 402, a different thickness in microns may be provided, such as a thickness in the range of 10 to 40 microns, or more particularly 20 to 25 microns, by way of non-limiting example, which varied thickness may be based, at least in part, upon the roughness of the RIA 402 along the ramp surface and particularly proximate to point 2.

As discussed throughout, various additive manufacturing methods may be employed in the embodiments. For example, although jetted inks, such as piezo-jetted inks, are discussed herein by way of particular example, other additive manufacturing methodologies, such as screen printing of inks, may be employed. Also as referenced throughout, the ink and print methods employed may depend on the design needs in particular embodiments, such as particular needs for ink thickness on certain surfaces or in certain operating environments, the ability to suitable address surface roughness at the top of, bottom of, or along the ramp, and/or contact resistance at one or more points along the RIA. For example, for certain RIA's, a screen printed ink may provide a 1.45 ohms/sq resistance, which may be acceptable in certain embodiments. However, a jetted ink may provide a contact resistance of $\frac{1}{10}$ to $\frac{1}{20}$ or less of that contact resistance in certain circumstances, which may be necessary in particular embodiments.

Figure 6:
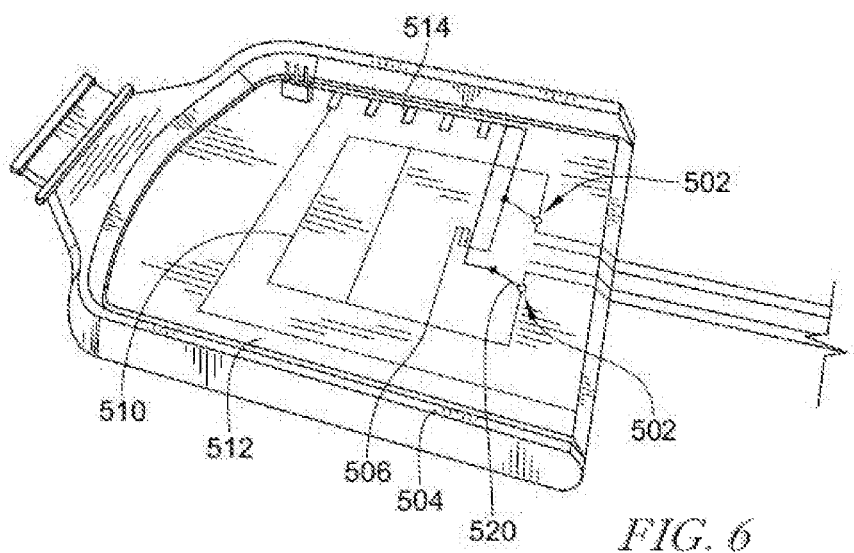
FIG. 6 provides a particular implementation of an exemplary RIA.

FIG. 6 provides a particular implementation of the RIA 502 as discussed herein. In the illustration, silver flake ink is screen printed on a polycarbonate film substrate 504 to provide the first layer circuit 506. Components 510 of the first layer circuit 506 are suitably and conductively bonded to the first layer circuit 506, and an end mold thermoplastic injection molding is used to provide the substrate 512 for the upper layer plane upon which the second layer circuit 514 is provided.

A machine, such as two-axis C&C machine, may machine into the molded material 512 that provides the plane for the second layer circuit 514 and may remove a thin layer at a time by interpolating along the cutting surface in order to create a ramp 520. Thereafter, a piezo-aerosol jet may dispense silver nanoparticle ink along the ramp 520, before, during, or after screen printing or similar dispensing to create the second level circuit 514. The printed RIA may require curing, such as curing at 85° C., for a given time period, such as 30 minutes.

Figure 7:
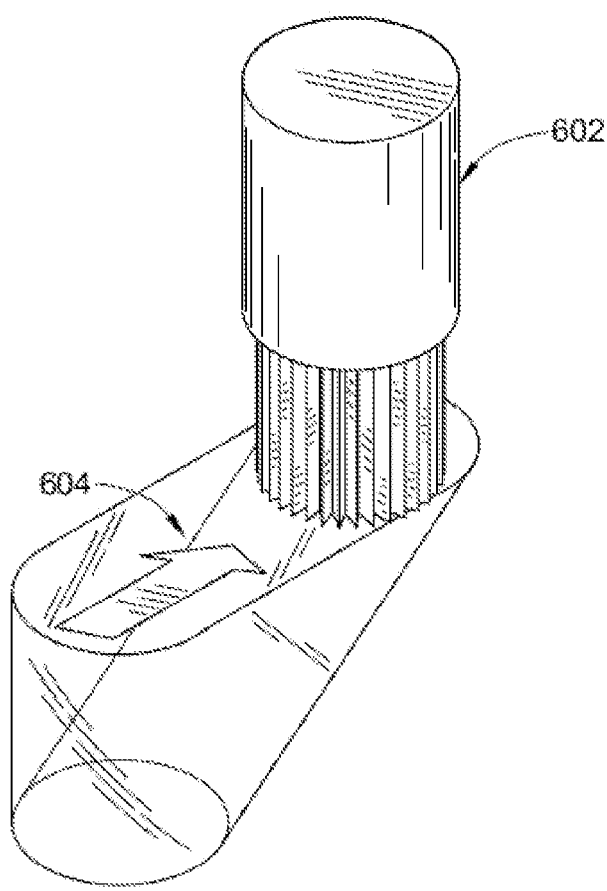
FIG. 7 illustrates the machining of a ramp for a RIA in accordance with some embodiments.

FIG. 7 illustrates with particularity the machining 602 of a ramp 604 in accordance with the embodiments. As shown, one thin layer at a time may be machined 602, such that layers are removed at an increasing depth on one side of the machined area as compared to the other. Thereby, a ramp 604 upon which a RIA may be created is provided.

Figure 8A:
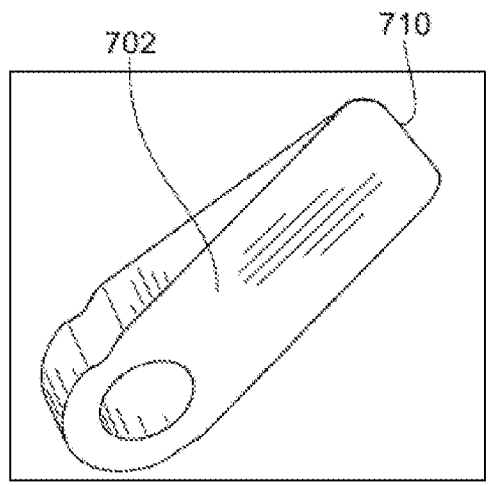
FIGS. 8A and 8B illustrate a machined RIA.
Figure 8B:
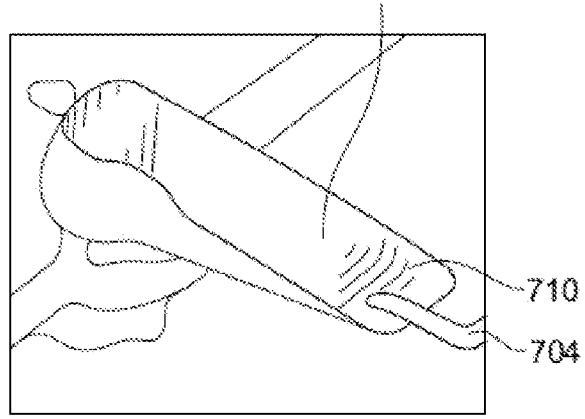

FIGS. 8A and 8B illustrate a machined ramp 702 without ink, and the same machined ramp 702 after printing of the ink 704 thereon. Of note particularly with respect to FIG. 8B, the size of the ink trace 704 as it is printed down the ramp may vary in accordance with the factors discussed herein throughout, as may the thickness thereof. For example, the size and thickness of the trace 704 may vary based on the roughness of the ramp surface, the sharpness at the inception point of the ramp 702 on the second layer circuit 710, and the steepness of the angle of the ramp 702 along which the RIA is printed, by way of non-limiting example.

Figure 8C:
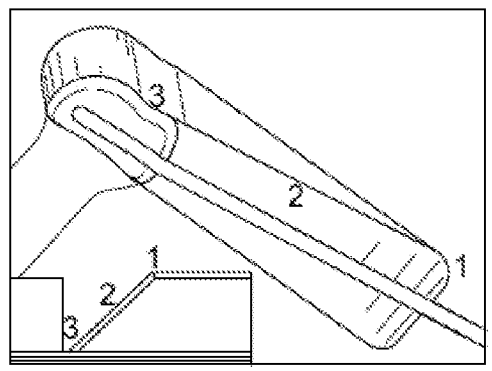
FIG. 8C illustrates the printed RIA of FIG. 8B in an isometric view.

FIG. 8C illustrates the printed RIA of FIG. 8B in an isometric view. Further, included in FIG. 8C is an inset cross-sectional schematic akin to that of FIG. 1, illustrating points 1, 2 and 3 of the RIA after printing as discussed throughout.

It will be understood, in light of the discussion herein, that various modifications may be made to the embodiments without departing from the scope of the disclosure, and such modifications may depend on design choices made. For example, the curing discussed herein of the RIA printed ramp trace, such as may occur at 85° C. for 30 minutes as referenced, may be dependent on the use of certain inks, such as a silver nanoparticle ink that contains 60 weight percent bulk silver. If other inks having other silver, or metal, contents are used, needless to say, the curing aspects may be varied or avoided. For example, it may be necessary that low temperature curing nanoparticle conductive inks are employed, such as in order to avoid degradation of temperature sensitive molded parts upon which the second layer circuit is provided. For example, an ABS molded part may have a glass transition temperature of 105° C., and thereby the curing for the ink used for the RIA must occur at a temperature well below this glass transition temperature.

In the foregoing Detailed Description, it can be seen that various features are often grouped together in a single embodiment for the purpose of clarity and brevity of the disclosure. This method of disclosure is not to be interpreted as reflecting an intention that the embodiments require more features than are expressly recited herein. Rather, the disclosure is to encompass all variations and modifications to the disclosed embodiments that would be understood to the skilled artisan in light of the disclosure.

What is claimed is:

1. An electrical interconnection system, comprising:
   a first semiconductor substrate having thereon a first electrical circuit;
   a second semiconductor substrate at least partially covering the first electrical circuit, and having thereon a second electrical circuit;
   a ramp passing through the second semiconductor substrate between first and second portions of the first electrical circuit and first and second portions of the second electrical circuit;
   and a conductive trace formed on the machined ramp to electrically connect the first or second portion of the first electrical circuit and the first or second portion of the second electrical circuit.

2. The system of claim 1, wherein the conductive trace comprises a nanoparticle conductive ink.

3. The system of claim 1, wherein the second semiconductor substrate comprises a molded substrate molded about the first or second portion of the first electrical circuit.

4. The system of claim 1, wherein the ramp is formed by one of laser drilling, laser micro machining, and C&C machining.

5. The system of claim 1, wherein the ramp comprises a triangular slice removed from the second semiconductor substrate.

6. The system of claim 1, wherein the first semiconductor substrate comprises a polycarbonate film.

7. The system of claim 1, wherein the second semiconductor substrate comprises a molded Acrylonitrile Butadiene Styrene (ABS).

8. The system of claim 1, wherein the ramp comprises an angle of between about 45° and about 70°.

9. The system of claim 1, wherein the ramp size comprises a range of about 800 microns to about 1000 microns.

10. The system of claim 1, wherein at least ones of the first electrical circuit and the second electrical circuit comprise surface mount technology (SMT) components.

11. The system of claim 1, wherein a thickness of the conductive trace is greatest at a plane provided by an uppermost portion of the second semiconductor substrate.

12. The system of claim 1, wherein particle size of the conductive trace is matched to a roughness of the ramp.

13. The system of claim 1, wherein the conductive trace is rounded at a plane provided by an uppermost portion of the second semiconductor substrate.

14. The system of claim 1, wherein a thickness of the conductive trace varies between about 10 and about 75 microns.

15. The system of claim 1, wherein the conductive trace comprises a contact resistance in a range of about 0.10 and about 1.50 ohms/sq.

16. The system of claim 1, wherein the conductive trace comprises a silver nanoparticle ink that contains about 60 weight/percent bulk silver.

* * * * *